United States Patent [19]
Yan et al.

[11] Patent Number: 5,390,202
[45] Date of Patent: Feb. 14, 1995

[54] REGENERATIVE OPTICAL PULSE GENERATOR

[75] Inventors: Chi Yan, Albuquerque, N. Mex.; Kalidev'Apura P. J. Reddy, Mathikere, India; Ravinder K. Jain; John G. McInerney, both of Albuquerque, N. Mex.

[73] Assignee: University of New Mexico, Albuquerque, N. Mex.

[21] Appl. No.: 995,852

[22] Filed: Dec. 23, 1992

[51] Int. Cl.$^6$ .................... H01S 3/131; H01S 3/136
[52] U.S. Cl. ........................ 372/26; 372/25; 372/30; 372/38
[58] Field of Search ............... 372/20, 25, 26, 30, 372/31, 38, 29

[56] References Cited
U.S. PATENT DOCUMENTS

| | | | |
|---|---|---|---|
| 3,617,932 | 11/1971 | Paoli et al. | 372/26 |
| 3,869,680 | 3/1975 | Fletcher et al. | 372/29 |
| 4,319,203 | 3/1982 | Brosio et al. | 372/30 |
| 4,665,524 | 5/1987 | Cotter | 372/25 |
| 4,698,817 | 10/1987 | Burley | 372/31 |

*Primary Examiner*—Georgia Y. Epps
*Assistant Examiner*—Robert McNutt
*Attorney, Agent, or Firm*—Albert Sopp; Robert W. Becker

[57] ABSTRACT

Filtered regenerative feedback is used to modulate a laser or other source of electromagnetic radiation to generate optical pulses whose amplitudes and repetition rates are continuously tunable. The technique is in principle applicable to any source of electromagnetic radiation and is especially effective for semiconductor diode lasers.

12 Claims, 1 Drawing Sheet

REGENERATIVE OPTICAL PULSE GENERATOR

FIELD OF THE INVENTION

The present invention relates in general to lasers and other sources of electromagnetic radiation configured to act as optical pulse generators, and more specifically to regenerative optical pulse generators.

BACKGROUND OF THE INVENTION

Short optical pulses are useful for numerous scientific and engineering applications: a partial list includes optical communication, time-resolved spectroscopy, optical radar, metrology, sampling and clock signal generation. There is special interest in laser-generated pulses because of their potentially high intensities, short durations and coherence properties.

Historically, means of generating short optical pulses have consisted of (a) amplitude (gain or loss) modulation or switching of a steady or quasi-steady source such as a lamp or a laser (continuous-wave (CW) or pulsed), or (b) mode-locking a laser (CW or pulsed). The latter technique, mode-locking, refers to a variety of regenerative schemes whereby one or more optical pulses is induced to circulate in a laser resonator in which it is narrowed, conditioned and stabilized over many complete round trips.

Gain/loss modulation schemes are relatively straightforward but require bulky and expensive external signal generators. These electronic signal generators are employed to produce sinusoidal waves or pulse trains which are then amplified and used to modulate the light source. The pulses produced using these techniques are relatively long in duration even when lasers are employed as sources. The mode-locking schemes do produce short pulses (the shortest pulses, ~10 fs, have been generated by mode-locking tunable lasers such as dye and titanium-sapphire devices) and can in some instances be made compact and inexpensive, but the mode-locking processes are very subtle and occur only h restricted parameter ranges, so that the pulse amplitudes are not easily variable. Also, since the pulse repetition rate equals the inverse of the optical round trip delay time in the laser resonator, tuning this repetition rate continuously is extremely difficult because it requires adjusting the optical length of the laser resonator while preserving perfect alignment. Moreover, because of the complicated dynamical nature of mode-locking involving an interplay between several laser and external parameters, mode-locked lasers are difficult to stabilize over extended periods (hours).

A hybrid technique, known as regenerative pulse generation, has been implemented using semiconductor diode lasers. As explained in "Frequency Stabilization and Narrowing of Optical Pulses from CW GaAs Injection Lasers", by T. L. Paoli and J. E. Ripper (IEEE Journal of Quantum Electronics, Vol. QE-6, p. 335, June 1970) and U.S. Pat. No. 3,641,459, a portion of the output light is detected to produce an electrical signal which is then amplified and used to stabilize the self-sustained pulsations emanating from the laser. In this technique the repetition rate of the pulsations is equal to the relaxation oscillation frequency of the laser diode, hence the pulse repetition rate has only limited tunability and limited choices of the center frequency of the tuning range, and changing the pulse repetition rate almost always results in changing the pulse amplitude considerably. Moreover, the existence of sustained self-pulsations is detrimental to the long-term reliability of the laser diode and these pulsations are considered undesirable.

In U.S. Pat. No. 3,617,932 entitled "Method for Pulse-Width-Modulating Semiconductor Lasers", by T. L. Paoli and J. E. Ripper, there is described a scheme in which laser diodes exhibiting sustained self-pulsations at constant pulse repetition rates are modulated by converting a portion of the output light into an electrical signal using a photodiode, then amplifying this signal and using it to modulate the existing pulsations. Again this technique uses lasers exhibiting self-sustained pulsations which have the same undesirable limitations as those discussed in the previous paragraph.

In "Optoelectronic Regenerative Pulser", by T. C. Damen and M. A. Duguay (Electronics Letters, Vol. 16, p. 166, Feb. 1980), them is described a regenerative pulse generation scheme in which a portion of the light output is convened into an electrical signal by a photodetector, this electrical signal then being amplified and applied directly without deliberate filtering to modulate the drive current to the diode laser. In this scheme the repetition rate is governed by the total feedback loop delay (i.e. the sum of the signal propagation delays in the optical and electrical portions of the loop) and the resulting optical pulses are unstable and noisy. While the pulse amplitude could be adjusted within broad limits, tuning of the pulse repetition rate is difficult, involving variation of the optical and/or electrical delay time. Moreover, initiation of the pulsations is achievable only by a relatively cumbersome process of first increasing the laser bias current to a "turn-on" value and then reducing it to the steady-state operating value.

In "Self-Sustained Picosecond Pulse Generation in a GaAlAs Laser at an Electrically Tunable Repetition Rate by Optoelectronic Feedback", by K. Y. Lau and A. Yariv (Applied Physics Letters, Vol. 45, p. 124, July 1984), them is discussed a technique involving application of similar optoelectronic feedback to a diode laser exhibiting sustained self-pulsations. In this arrangement the pulse repetition rate is tuned by varying the self-pulsing frequency, which is accomplished by adjusting the drive current to the laser diode. This scheme involves undesirable self-pulsations as discussed in the previous paragraphs, and varying the pulse repetition rate is difficult and usually necessitates changing the pulse amplitude and pulse width.

SUMMARY OF THE INVENTION

In accordance with an embodiment of the present invention, a portion of the optical signal from a light source is converted by a detector to an electrical or other control signal which is filtered or conditioned electrically or by other means into a bandwidth much narrower than that of the original control signal to modulate either the light source directly or the output thereof, to produce optical pulses of short duration and of independently variable amplitude and pulse repetition rate. While this technique is especially appropriate for semiconductor diode lasers because of the ease with which these lasers may be modulated, the scheme may in principle be applied to any light source or to signal sources covering other portions of the electromagnetic wave spectrum. As a matter of convenience we shall refer to any such source as a "light source".

In accordance with an embodiment of the invention, there is generated very stable and short (typically 1–100 ps) optical pulses with easily variable amplitudes and continuously tunable repetition rates, in a relatively simple and compact arrangement. In one arrangement, there is provided an optical detector to convert a portion of the light produced by a source capable of being modulated (i.e. a "modulatable source") to an electrical or other signal, followed by a narrow band or low frequency filtering arrangement to act on said signal by restricting or filtering out fluctuations, e.g., noise, in said signal to a narrow range, typically a few percent of the total spectral bandwidth of the fluctuations. The filtering arrangement may be passive, i.e. with no amplification, or active, i.e., with amplification. The filtered amplified or unamplified, relatively clean signal then serves as a driving signal to modulate the light source. As is well known in the art, such modulation may be accomplished directly by modulating the light source itself, or indirectly via a light modulator or amplifier external to the source. Thus the light or electromagnetic wave source may be modulated by the narrow band driving signal in accordance with the invention to produce pulses of varying duration, preferably short pulses 1–100 ps in duration, with continuously variable amplitude and repetition rate, the latter varying with the center frequency in the narrow band. Unlike prior art arrangements, the arrangement of the present invention does not require that the source exhibit self-sustained pulsations, nor is it required that the source be first driven to a "turn-on" condition to initiate pulsations before being set at the steady operating state.

BRIEF DESCRIPTION OF THE DRAWINGS

Reference is now made to the drawings in which.

DETAILED DESCRIPTION OF THE INVENTION

Figure 1:
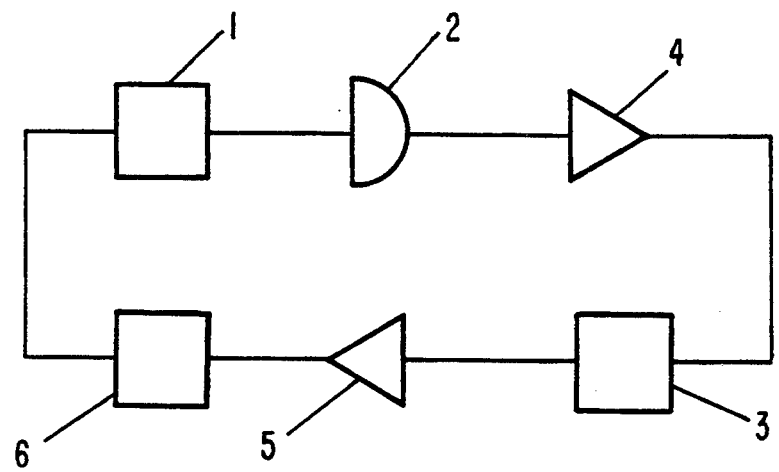
FIGS. 1 and 2 are schematic block diagrams of respective embodiments of the present invention, the elements of which are well known in the art and may be of any suitable well known construction.

Referring to FIG. 1, a portion of the electromagnetic wave output from a light source 1, which may be a semiconductor laser diode or other source of coherent or incoherent electromagnetic radiation, is coupled to a detector 2 which converts the output to an electrical or other control signal. The control signal produced by detector 2 is in turn fed to a filtering arrangement comprising a filter 3 and an optional amplifier 4 which first receives the control signal. The filtering arrangement acts on said control signal by restricting passage of fluctuations e.g., noise, in said control signal to a narrow chosen range of frequencies, typically covering only a few percent of the total frequency spectrum of the fluctuations in the source output. The pulse repetition rate may be varied by adjusting the center frequency of the said narrow chosen range of frequencies. Such filtering arrangements are well known in the art and may be of any suitable well known design. After the control signal has been filtered by the filtering arrangement 3, it is used to modulate the light source 1. Such modulation may be accomplished by directly modulating the light source itself in a manner well known in the art, or indirectly by modulating a light amplifier or modulator coupled to the source, thus modulating the output from the light source. The pulse amplitude may be varied by adjusting the continuous or DC drive signal to the source and/or the regenerative loop gain.

In order to improve the modulation efficiency, an optional post-amplifier 5 may be connected between the filter 3 and the source 1. Also, there may be optionally included in the circuit between the output of the filter 3 and the light source 1 a nonlinear element 6 of any suitable well known design for generating harmonics of the frequencies selected by the filtering arrangement 3. Such nonlinear elements are well-known in the art, and include nonlinear transmission line sections, step recovery diodes, or comb generators.

Figure 2:
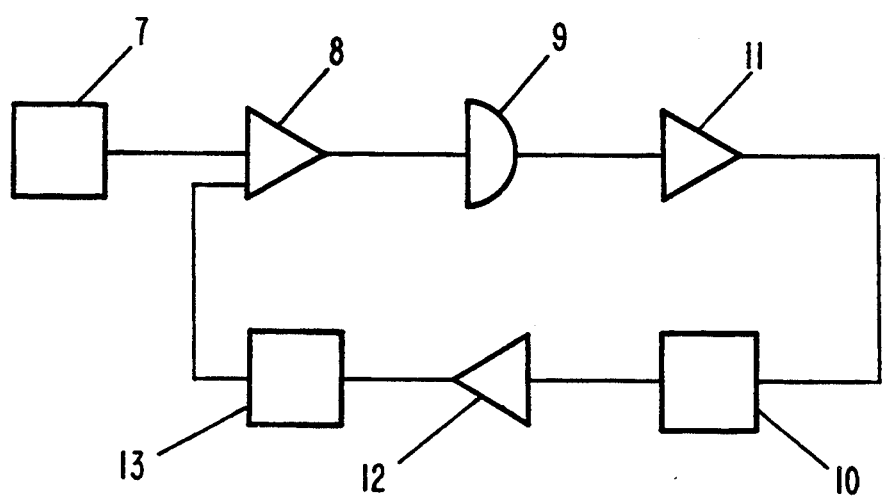

FIG. 2 shows another embodiment of the invention in which a light source 7, for example, a semiconductor laser diode, is coupled to an external light amplifier or modulator 8 in an arrangement similar to that of FIG. 1. The output from the source 7 is sampled by a detector 9 which generates an electrical or other control signal which is filtered by a narrow bandpass filter 10. As in the system depicted in FIG. 1, the control signal may optionally be amplified by a preamplifier 11 before reaching the filter 10. An optional post-amplifier 12 may be connected to amplify the output of the filter 10. In this particular embodiment the filtered and, optionally, amplified control signal is applied to modulate the external light amplifier or modulator 8. In a similar manner to that described in connection with FIG. 1, there may be inserted an optional nonlinear element 13 between the post-amplifier 12 and the external amplifier or modulator 8 for generating harmonics of the frequencies selected by the filtering arrangement 10.

As an example, using a conventional CW laser diode operating at a wavelength of 850 nm in a 500 MHz pulse train, pulses as short as 35 ps were obtained with excellent phase and amplitude stability. The pulse repetition rate was easily controllable in the range 200 MHz to 500 MHz. Similar results have been obtained with other laser diodes operating at wavelengths of 780 to 950 nm. It is expected that, with suitable well-known components, continuous tuning of the pulse repetition rate could be achieved from less than about 10 Hz to about 30 GHz. While various embodiments of the invention have been described with specific reference to the drawings, other versions will occur to those skilled in the art.

We claim:

1. A method of producing pulsed electromagnetic radiation, the method comprising the steps of:
   a) providing a modulatable source of electromagnetic radiation driven by an external, continuous drive signal, said source having instantaneous fluctuations in intensity;
   b) coupling a portion of the output produced by the source to a detector to produce an electrical control signal whose frequency spectrum corresponds to the instantaneous fluctuations of the intensity of the source;
   c) filtering the control signal with a narrow bandpass filter, said filter having a pass-band peak frequency selected to correspond to a desired pulse repetition frequency;
   d) modulating the drive signal of the source directly or modulating the output thereof with said filtered control signal, thereby causing short duration pulses to be radiated by said source at a pulse repetition frequency corresponding to the selected pass-band peak frequency of step c;

whereby the output of a continuously driven source of electromagnetic radiation is converted into pulsed radiation at a pulse repetition frequency corresponding to the pass-band peak frequency e) varying the pulse repetition frequency output of said source by varying the pass band frequency of said narrow bandpass filter.

2. The method of producing pulses as set forth in claim 1 with the further step of f) varying the amplitude of the pulses produced by steps a) through e) by varying the amplitude of one or both of said continuous drive signal to the source and said filtered control signal;

whereby the output of a continuously driven source of electromagnetic radiation is converted into pulsed radiation of easily varied amplitude and pulse repetition frequency.

3. The method of producing pulses as set forth in claim 1 wherein said source of electromagnetic radiation is light, that is, within the wavelength range between ultraviolet and far infrared radiation.

4. The method of producing pulses as set forth in claim 3 wherein said source of electromagnetic radiation is a laser.

5. The method of producing short duration pulses as set forth in claim 4 wherein said source of electromagnetic radiation is a semiconductor laser.

6. The method of producing pulses as set forth in claim 1 wherein step c) includes introducing a non-linear element for producing harmonics of said filtered control signal;

whereby shorter pulses may be generated.

7. A pulse generator comprising:

a) a modulatable source of electromagnetic radiation driven by an external, continuous drive signal and having detectable fluctuations of intensity:

b) detector means to convert a portion of the source radiation into a control signal having a frequency spectrum that corresponds to the instantaneous fluctuations of the intensity of the source;

c) a narrow bandpass filter means to filter the control signal, said filter means having a pass-band peak frequency that may be selected as desired;

d) means to modulate the source drive signal or the output thereof by the filtered control signal;

whereby the output of a continuously driven source of electromagnetic radiation is converted into pulsed radiation whose pulse repetition frequency corresponds to the selected pass-band peak frequency e) means to vary the pass-band peak frequency such that the pulse repetition frequency of the generated pulses will correspond to the varied pass-band peak frequency.

8. The pulse generator of claim 7 including further f) means to vary the amplitude of one of said source drive signals and said filtered control signals to thereby vary the pulse amplitude;

whereby the output of a continuously driven source of electromagnetic radiation is converted into pulsed radiation having easily varied pulse amplitude and pulse repetition frequency.

9. The pulse generator of claim 7 wherein said modulatable source is light, that is, electromagnetic radiation within the wavelength range between ultraviolet and the far infrared.

10. The pulse generator claim 9 wherein said modulatable source is a laser.

11. The pulse generator of claim 10 wherein said modulatable source is a semiconductor laser.

12. The pulse generator of claim 7 wherein said means to modulate said source drive signal includes a non-linear element means for producing harmonics of said filtered control signal;

whereby shorter pulses may be generated.

* * * * *